Oct. 28, 1958

J. P. GIACOLETTO 2,858,440

TUNER

Filed April 1, 1955

INVENTOR.
JOHN P. GIACOLETTO
BY Marvin Moody
ATTORNEY

United States Patent Office 2,858,440

Patented Oct. 28, 1958

2,858,440

TUNER

John P. Giacoletto, Cedar Rapids, Iowa, assignor to Collins Radio Company, Cedar Rapids, Iowa, a corporation of Iowa Application April 1, 1955, Serial No. 498,647

2 Claims. (Cl. 250—40)

Figures 1, 2, 3, 4, 5:
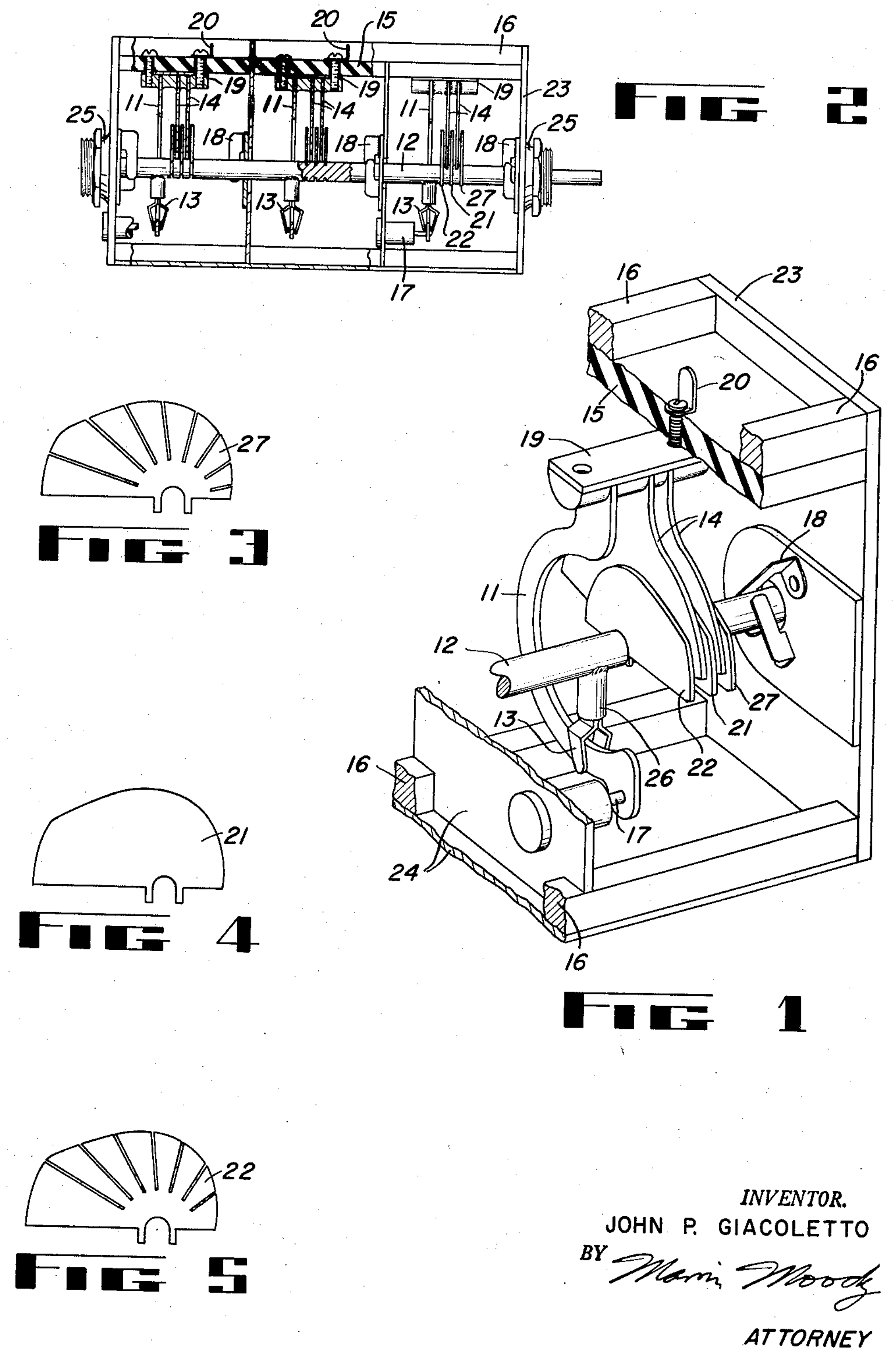

This invention relates to a radio-frequency tuning device and more particularly to parallel resonance tuning devices.

Priorly in the tuning of radio frequencies above 100 megacycles per second, it has been difficult to obtain a straight-line tuning curve. It has been priorly attempted to control the tuning of radio frequencies of this order of magnitude by varying either the inductance or capacitance. This has made the tuning devices quite cumbersome and often very difficult to control so as to obtain linear tuning.

It is a feature of this invention that by changing the inductance and capacitance simultaneously and by controlling the shape of the capacitive and inductive elements, linear tuning is obtained. It is a further feature of this invention that an approximately constant L/C ratio is maintained as the frequency is varied. This invention thus provides a linear tuning device which maintains a relatively constant inductive-capacitive ratio.

It is an object of this invention to provide a variable tuning device which will cover a wide frequency range. It is a further object of this invention to provide a tuning device which is small in size and economical to construct.

This invention provides a tuning device which is physically smaller than prior tuning devices and which is quite easily adjusted to tune linearly while maintaining a constant L/C ratio.

It is a still further object of this invention to provide a tuning device which has straight-line tuning characteristics. It is another object of this invention to provide a tuning device which simultaneously changes the inductance and capacity values of the tuned circuit to provide straight-line tuning characteristics and a relatively constant L/C ratio.

It is still another object of this invention to provide a tuning device which is tunable by rotary motion to produce a straight-line tuning characteristic. It is a still further object of this invention that several units of this invention may be assembled on a single shaft for multiple stage tuning, with each unit following the same tuning curve. These and other objects of this invention will become apparent when the following description is read in conjunction with the accompanying drawing, in which:

Figure 1 consists of a perspective view of one embodiment of this invention;

Figure 2 consists of a partially sectionalized elevation view of a plurality of units of this invention; and Figures 3, 4, and 5 are detailed representations of the capacitor plates of this invention.

This invention produces a parallel resonant circuit wherein the inductance and capacitance are connected in a parallel relationship. The formula for the resonant frequency of a parallel resonant circuit is:

$$F=\frac{1}{2\pi\sqrt{LC}}$$

This invention simultaneously changes the inductance and capacitance of a resonant circuit from high to low values, thereby obtaining various resonant frequencies.

The inductance member of this invention is a portion of a circular metallic strip 11. This metallic strip 11 is positioned with the plane of the strip parallel to the plane of the fixed capacitor plates, and is electrically connected to a metallic block 19. Lug 20, a circuit connection, is electrically connected to strip 19. This invention operates most successfully if all metallic elements have low resistance characteristice, silver-plated brass being a good example. Connected to block 19 are two fixed capacitor plates 14. These plates are of low electrical resistance and are essentially portions of thin metallic sheets. These elements 11, 19, and 14 are then mounted on a non-conductive or dielectric plate 15. This dielectric plate 15 is fastened to metallic blocks 16 which are in turn fastened to a metallic plate 23. Metallic plates 24 constitute the remainder of the metallic U-shaped exterior framework of this invention, which U-shaped framework is closed by the dielectric plate 15. This framework need not be of this shape or of these materials, but this embodiment appears to perform most satisfactorily.

To prevent the electrical connection of plates 14 to the shaft 12, these plates have their center portion cut out. The shaft 12 is positioned by bearings 25, as shown in Figure 2, and is positioned in the center of the circular metallic ring 11. The shaft carries wiper blades 13 and rotating capacitor plates 21, 22, and 27. The wiper blades 13 are connected to the shaft 12 by a metallic rod 26, although any suitable electrical connection may be utilized. The rotating capacitor plates are metallic and are of arcuate configuration with slots cut in the broad plane of certain of the plates, as shown in Figures 3, 4, and 5. The rotating capacitor plates are placed upon the shaft in such a position that when the shaft is rotated they interleave with plates 14 such that the slotted plates are exterior to the fixed plates and a non-slotted plate passes between the fixed plates.

The angular relationship between the wiper blades 13 and the plates 21, 22, and 27 is such that when the rotating capacitor plates are completely meshed with the plates 14, wiper blades 13 are on a radius line to shaft 12 from the point on ring 11 which is supported by pin 17. Pin 17 consists of insulating material into which a brass pin is fastened to connect to ring 11.

The inductance value is greatest at this position of the wiper blades 13. Likewise, the value of the capacitance between the plates is greatest at this position. Now, as the shaft 12 is rotated to move the wiper blades to a position on ring 11 opposite the block 19, the capacitance value is decreased and the inductance value is also decreased, with a constant L/C ratio being maintained. This provides the necessary tuning so that the resonant frequency is linearly changed. The grounding springs 18 are placed on each tuned circuit section to provide ground connection of shaft 12 to the chassis member 23.

The resonant frequency of the circuit which is produced by this invention at each degree of rotation may be controlled by varying the shape of the capacitor plates either by changing their contour or by varying their configuration by the bending of the slotted portions, or by changing the shape of the inductance ring 11.

In one particular embodiment of this invention which was constructed, a frequency range of 220 to 400 megacycles was tuned with 180 degrees rotation of the rotating capacitor plates and the wiper blades. The frequency varies as the angular rotation varies and the impedance of the circuit tends to remain constant due to simultaneous variation of L and C. The tuning elements must originally be designed to have the proper capacitance and inductance values to tune resonant frequencies in the prescribed frequency range.

Although this invention has been described with respect to a particular embodiment thereof, it is not to be so limited, as changes and modifications may be made therein which are within the full intended scope of the invention as defined by the appended claims.

What is claimed is:

1. A radio-frequency tuning device comprising a U-shaped member of conductive material, said U-shaped member closed with a non-conductive member, coupling means, said coupling means affixed to said non-conductive member, an inductor element comprising a section of a circular piece of conductive material having one end electrically connected to said coupling means and the other end electrically isolated from the sides of said U-shaped member, a rotatable shaft positioned at right angles to the plane of the two opposite conductive sides of said U-shaped member and having said inductor centered around it, said shaft grounded to said conductive sides, a plurality of capacitor plates connected in parallel with said inductor to said coupling means, said inductor element formed of sheet material having one of its narrow edges facing said rotatable shaft and having the flat surfaces thereof parallel to said capacitor plates, means comprising a plurality of metallic plates having a substantially arcuate form attached to said shaft for accurately varying the capacitance value of said capacitor plates by interleaving said plates as said shaft is rotated and means comprising wiper blades attached to said shaft on a radius line from the shaft to the end of said inductor which is electrically isolated from the sides when said capacitor plates and said interleaving plates are completely meshed for accurately and simultaneously varying the inductance value whereby the resonant frequency is linearly varied and a substantially constant L/C ratio maintained as said shaft rotates.

2. A radio-frequency tuning device comprising a U-shaped structural member of conductive material closed with non-conductive material, output means, said output means affixed to said non-conductive material, an inductor element comprising a section of a circular piece of conductive material having one end electrically connected to said output means and the other end electrically isolated from the sides of said U-shaped structural member, a rotatable shaft positioned at right angles to the plane of the opposite sides of said U-shaped structural member and having said inductor element centered around it, said shaft grounded to the metallic sides of said structural member, a plurality of fixed capacitor plates connected in parallel with said inductor to said output means, said inductor element formed of sheet material having one of its narrow edges facing said rotatable shaft and having the flat surfaces thereof parallel to said capacitor plates, means for varying the capacitance value of said fixed capacitor plates by interleaving said plates with a plurality of metallic plates having a substantially arcuate contour, said means including certain of said plates having slots cut therein on the periphery for varying the capacitance value due to the interleaving, said means attached to said shaft and interleaved by the rotation of said shaft, and means comprising wiper blades attached to said shaft on a radius line from the shaft to the end of said inductor element electrically isolated from the sides when said fixed capacitor plates and said interleaving plates are completely meshed for simultaneously varying the inductance value whereby a constant L/C ratio is maintained as the resonant frequency is linearly varied by rotation of said shaft.

References Cited in the file of this patent

UNITED STATES PATENTS

| | | |
|---|---|---|
| 2,367,681 | Karplus | Jan. 23, 1945 |
| 2,508,138 | Bernstein | May 16, 1950 |
| 2,511,586 | Hubbard | June 13, 1950 |
| 2,540,137 | Page | Feb. 6, 1951 |
| 2,585,844 | Romero | Feb. 12, 1952 |

OTHER REFERENCES

QST, April 1945, pp. 48, 49, "Wide-Range Tank Circuits for V. H. F. and U. H. F.," Gable et al.